(12) United States Patent
Hamamoto et al.

(10) Patent No.: US 9,306,133 B2
(45) Date of Patent: Apr. 5, 2016

(54) OPTICAL SEMICONDUCTOR DEVICE

(75) Inventors: Yoshihira Hamamoto, Annaka (JP); Manabu Ueno, Tokyo (JP); Tsutomu Kashiwagi, Annaka (JP)

(73) Assignee: SHIN-ETSU CHEMICAL CO., LTD., Tokyo (JP)

( * ) Notice: Subject to any disclaimer, the term of this patent is extended or adjusted under 35 U.S.C. 154(b) by 564 days.

(21) Appl. No.: 13/584,426

(22) Filed: Aug. 13, 2012

(65) Prior Publication Data

US 2013/0056786 A1 Mar. 7, 2013

(30) Foreign Application Priority Data

Sep. 2, 2011 (JP) ................................. 2011-192013

(51) Int. Cl.
| | |
|---|---|
| *C08G 77/08* | (2006.01) |
| *H01L 33/56* | (2010.01) |
| *C08L 83/04* | (2006.01) |
| *H01L 33/46* | (2010.01) |

(52) U.S. Cl.
CPC .................. *H01L 33/56* (2013.01); *C08L 83/04* (2013.01); *H01L 33/46* (2013.01); *H01L 2224/16245* (2013.01); *H01L 2224/32245* (2013.01); *H01L 2224/45144* (2013.01); *H01L 2224/48091* (2013.01); *H01L 2224/48247* (2013.01); *H01L 2224/73265* (2013.01); *H01L 2924/12044* (2013.01)

(58) Field of Classification Search
CPC .......... H01L 33/56; H01L 33/46; C08L 83/04
See application file for complete search history.

(56) References Cited

U.S. PATENT DOCUMENTS

| | | | |
|---|---|---|---|
| 2007/0112147 A1* | 5/2007 | Morita et al. ................. | 525/478 |
| 2008/0070333 A1 | 3/2008 | Morita et al. | |
| 2008/0262158 A1 | 10/2008 | Morita et al. | |
| 2009/0179180 A1 | 7/2009 | Morita et al. | |
| 2009/0294796 A1 | 12/2009 | Morita et al. | |
| 2010/0145000 A1 | 6/2010 | Kimura | |
| 2010/0200890 A1 | 8/2010 | Tomiyama et al. | |
| 2010/0301377 A1 | 12/2010 | Kato et al. | |
| 2011/0160410 A1* | 6/2011 | Sagawa et al. ................ | 525/478 |
| 2011/0309407 A1* | 12/2011 | Hamamoto et al. .......... | 257/100 |

FOREIGN PATENT DOCUMENTS

| | | |
|---|---|---|
| CN | 1863875 A | 11/2006 |
| CN | 1993427 A | 7/2007 |
| CN | 101466795 A | 6/2009 |
| CN | 101506309 A | 8/2009 |
| CN | 101608068 A | 12/2009 |
| CN | 101891959 A | 11/2010 |
| CN | 102066493 A | 5/2011 |
| JP | A-07-025987 | 1/1995 |
| JP | B2-3241338 | 10/2001 |
| JP | A-2002-327126 | 11/2002 |
| JP | A-2002-338833 | 11/2002 |
| JP | 2006-093354 A | 4/2006 |
| JP | 2007-327019 A | 12/2007 |
| JP | A-2011-009346 | 1/2011 |
| TW | 201119101 A | 6/2011 |
| WO | 2008/133271 A1 | 11/2008 |
| WO | 2009/154260 | * 12/2009 |

OTHER PUBLICATIONS

Oct. 21, 2014 Decision of Refusal issued in Japanese Patent Application No. 2011-192013 (with English translation).
Jan. 28, 2014 Japanese Office Action issued in Japanese Application No. 2011-192013 (with partial translation).
Jul. 20, 2015 Office Action issued in Taiwanese Application No. 101130422.
Nov. 4, 2015 Office Action issued in Japanese Application No. 2014-257022.
Nov. 4, 2015 Office Action issued in Japanese Application No. 2011-192013.
Sep. 14, 2015 Office Action issued in Chinese Application No. 2012103204745.

* cited by examiner

*Primary Examiner* — Margaret Moore
(74) *Attorney, Agent, or Firm* — Oliff PLC

(57) ABSTRACT

An optical semiconductor device in which an optical semiconductor element connected to a silver-plated copper lead frame is sealed with an addition curing silicone resin composition, the addition curing silicone resin composition having (A) organopolysiloxane that contains an aryl group and an alkenyl group and does not contain an epoxy group; (B) organohydrogenpolysiloxane that has at least two hydrosilyl groups per molecule and an aryl group, the organohydrogenpolysiloxane that contains 30 mol % or more of an $HR_2SiO_{0.5}$ unit in a constituent unit having an amount that a molar ratio of the hydrosilyl group in the component (B) with respect to the alkenyl group in the component (A) is 0.70 to 1.00; and (C) a hydrosilylation catalyst having a catalytic amount.

14 Claims, 1 Drawing Sheet

OPTICAL SEMICONDUCTOR DEVICE

BACKGROUND OF THE INVENTION

1. Field of the Invention

The present invention relates to an optical semiconductor device, and more particularly to an optical semiconductor device sealed with an addition curing silicone resin composition.

2. Description of the Related Art

A high-intensity light-emitting diode (LED) having high intensity of light and a large amount of heat generation has been recently produced on a commercial base and extensively used.

Such an LED device is manufactured by using a cup-like premolded package integrally molded with a lead frame, mounting an LED in this package, and sealing it with a sealing resin. At this time, to assure conductivity at the time of mounting the LED and enhance reflection efficiency of the LED, copper is usually used as a base metal of the lead frame, and this material is subjected to silver plating, but there is a tendency of reducing a thickness of the silver plating to decrease a manufacturing cost.

On the other hand, there is a demand for a cured product of a sealing resin to have transparency because of its properties, and an epoxy resin composition made of an epoxy resin such as a bisphenol A epoxy resin or an alicyclic epoxy resin and an acid anhydride based curing agent is generally used (Patent Document 1, Patent Document 2). However, there arises a problem that a cured product of such an epoxy resin composition has low lightfast durability since transmittance for light rays having a short wavelength is low or this material is colored due to light deterioration.

Therefore, as the sealing resin, there has been suggested an addition curing silicone resin composition consisting of an organic compound having at least two carbon-carbon double bonds, which have reactive properties to a hydrosilyl group (SiH group), per molecule, a silicon compound having at least two SiH groups per molecule, and a hydrosilylation catalyst (Patent Document 3, Patent Document 4). However, in a cured product (the sealing resin) of such an addition curing silicone resin composition, there occurs a problem that silver ions are diffused in a thin plated layer, reach a sealing resin layer, and are discolored into brown to deteriorate luminance in a combination with the lead frame having thinly-silver-plated copper, and hence quality of the LED device is lowered. That is, as a current situation, using such an addition curing silicone resin composition does not lead to acquisition of the LED device that suppresses discoloration of a cured product of this resin composition and has excellent durability of reflection efficiency.

Patent Document 1: Japanese Patent No. 3241338
Patent Document 2: Japanese Unexamined Patent Application Publication No. H7-25987
Patent Document 3: Japanese Unexamined Patent Application Publication No. 2002-327126
Patent Document 4: Japanese Unexamined Patent Application Publication No. 2002-338833

SUMMARY OF THE INVENTION

In view of the above-described circumstances, it is an object of the present invention to provide an optical semiconductor device that suppresses discoloration of a cured product of an aryl group containing addition curing silicone resin composition that is a sealing resin and has excellent durability of reflection efficiency.

According to the present invention, there is provided an optical semiconductor device in which an optical semiconductor element connected to a silver-plated copper lead frame is sealed with a cured product of an addition curing silicone resin composition, wherein the addition curing silicone resin composition comprises:

(A) organopolysiloxane that contains an aryl group and an alkenyl group and does not contain an epoxy group;

(B) organohydrogenpolysiloxane that has at least two hydrosilyl groups (SiH groups) per molecule and also has an aryl group, the organohydrogenpolysiloxane that contains 30 mol % or more of an $HR_2SiO_{0.5}$ unit (R represents the same or different monovalent hydrocarbon groups which contain no aliphatic unsaturated bond) in a constituent unit having an amount that a molar ratio of the hydrosilyl group in the component (B) with respect to the alkenyl group in the component (A) (SiH group/alkenyl group) is 0.70 to 1.00; and (C) a hydrosilylation catalyst having a catalytic amount.

When such an addition curing silicone resin composition is combined with the lead frame made of silver-plated copper, it is possible to provide the optical semiconductor device that suppresses discoloration of a cured product of the addition curing silicone resin composition as the sealing resin and has excellent durability of reflection efficiency.

Further, the component (A) in the addition curing silicone resin composition is preferably a mixture of a silicone resin and a silicone oil. When the mixture of the silicone resin and the silicone oil is adopted, the sealing resin can have appropriate hardness, strength, elasticity, shock strength, and others.

Furthermore, the component (B) in the addition curing silicone resin component is preferably organohydrogenpolysiloxane represented by the following formula (B1) and/or (B2). When this organohydrogenpolysiloxane is used, discoloration of a cured product due to silver ions can be further reduced,

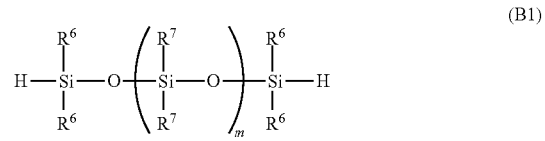
(B1)

wherein $R^6$ represents a monovalent hydrocarbon group having a carbon number of 1 to 100, $R^7$ represents a monovalent hydrocarbon group containing at least one aryl group, and m represents an integer of 1 to 4,

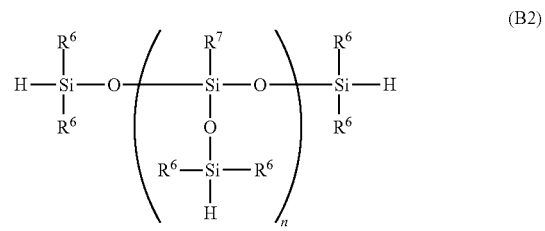
(B2)

wherein $R^6$ and $R^7$ are equal to those described above, and n represents an integer of 1 to 100.

Moreover, the addition curing silicone resin component preferably contains an adhesion promoter (D) and, in particular, the component (D) is preferably organopolysiloxane containing an aryl group, an alkenyl group, and an epoxy group per molecule.

As a result, the addition curing silicone resin composition having higher adherence properties can be provided.

Additionally, using the lead frame that has been subjected to a plasma treatment is more effective.

When the plasma treatment is carried out as described above, the lead frame having high wettability for the addition curing silicone resin composition can be obtained, and the adherence properties can be improved. When a molar ratio of the SiH group and the alkenyl group is adjusted even though the activated silver is eluted on the surface, the optical semiconductor device having excellent resistance to discoloration can be provided.

Further, the optical semiconductor device has a cup-like premolded package integrally molded in such a manner that the lead frame is arranged on an inner bottom surface, in the premolded package, an electrode of the optical semiconductor element is connected to the lead frame through a conductive adhesive and a conductive wire and the optical semiconductor element is thereby mounted, or the electrode of the optical semiconductor element is faced down through a solder bump and collectively connected to the lead frame and the optical semiconductor element is thereby flip-chip-mounted, and the inside of the premolded package is sealed with the addition curing silicone resin composition.

Furthermore, the optical semiconductor device has a substrate having the lead frame arranged thereon, the substrate having the optical semiconductor element, which is connected to the lead frame through a conductive adhesive and a conductive wire, mounted thereon being molded with the addition curing silicone resin composition, cured, and diced.

Such an optical semiconductor device can be an optical semiconductor device that suppresses discoloration of a cured product of the addition curing silicon resin composition and has excellent durability of reflection efficiency.

As described above, according to the present invention, it is possible to provide the optical semiconductor device that suppresses the discoloration of a cured product of the addition curing silicon resin composition as the sealing resin and has the excellent durability of reflection efficiency.

DETAILED DESCRIPTION OF THE PREFERRED EMBODIMENTS

Figure 1:
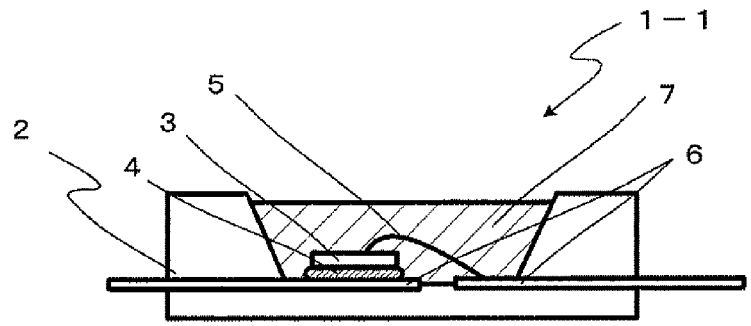
FIG. 1 is a schematic cross-sectional view showing a first mode of an optical semiconductor device according to the present invention.

The present invention will now be described hereinafter in detail. As described above, development of an optical semiconductor device that suppresses decoloration of a cured product of addition curing silicone resin composition and has excellent durability of reflection efficiency has been demanded.

To achieve the object, as a result of devoting the present inventors themselves to examination, it can be considered that silver ions are dispersed in a thin plated layer and reach a plating interface or a sealing resin layer in a combination of a cured product (a sealing resin) of an addition curing silicone resin composition and a lead frame containing copper having a thin silver coat thereon. It is considered that a cause of decoloration into brown is that silver on a silver-plated surface is oxidized to silver ions by heat and the like, eluted, and reduced to nano-silver reacting with SiH in the resin, and the present inventors have revealed that setting a molar ratio of a hydrosilyl group to an alkenyl group in the addition curing silicone resin composition to 0.70 to 1.00 enables obtaining an optical semiconductor device that can suppress precipitation of silver and decoloration of a cured product of this composition and has excellent durability of reflection efficiency, thereby bringing the present invention to completion. The present invention will now be described hereinafter in detail.

[Optical Semiconductor Device]

According to the present invention, there is provided an optical semiconductor device in which an optical semiconductor element connected to a silver-plated copper lead frame is sealed with a cured product of an addition curing silicone resin composition, wherein the addition curing silicone resin composition comprises:

(A) organopolysiloxane that contains an aryl group and an alkenyl group and does not contain an epoxy group;

(B) organohydrogenpolysiloxane that has at least two hydrosilyl groups (SiH groups) per molecule and also has an aryl group, the organohydrogenpolysiloxane that contains 30 mol % or more of an $HR_7SiO_{0.5}$ unit (R represents the same or different monovalent hydrocarbon groups which contain no aliphatic unsaturated bond) in a constituent unit having an amount that a molar ratio of the hydrosilyl group in the component (B) with respect to the alkenyl group in the component (A) (SiH group/alkenyl group) is 0.70 to 1.00; and (C) a hydrosilylation catalyst having a catalytic amount.

Here, the optical semiconductor device has a cup-like premolded package integrally molded in such a manner that the lead frame is arranged on an inner bottom surface, in the premolded package, an electrode of the optical semiconductor element is connected to the lead frame through a conductive adhesive and a conductive wire and the optical semiconductor element is thereby mounted, or the electrode of the optical semiconductor element is faced down through a solder bump and collectively connected to the lead frame and the optical semiconductor element is thereby flip-chip-mounted, and the inside of the premolded package is sealed with the addition curing silicone resin composition.

Furthermore, the optical semiconductor device has a substrate having the lead frame arranged thereon, the substrate having the optical semiconductor element, which is connected to the lead frame through a conductive adhesive and a conductive wire, mounted thereon being molded with the addition curing silicone resin composition, cured, and diced.

Such an optical semiconductor device is an optical semiconductor device that suppresses discoloration of a cured product of the addition curing silicone resin composition and has excellent durability of reflection efficiency. First, a configuration of the optical semiconductor device will now be specifically described with reference to the drawings.

Figure 2:
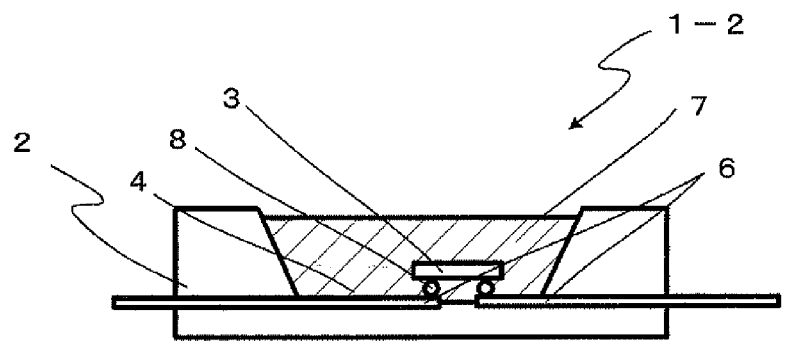
FIG. 2 is a schematic cross-sectional view showing a second mode of the optical semiconductor device according to the present invention.

FIG. 1 and FIG. 2 are schematic cross-sectional views of optical semiconductor devices according to a first mode and a second mode of the optical semiconductor device according to the present invention. An optical semiconductor device 1-1 depicted in FIG. 1 is configured in such a manner that a non-illustrated electrode of an optical semiconductor element is connected to a lead frame 6 through a conductive adhesive 4 and a conductive wire 5 and the optical semiconductor element 3 is mounted in a cup-like premolded package 2 integrally molded so that the lead frame 6 can be arranged on an internal bottom surface, and the inside of the premolded package 2 is sealed with a sealing resin 7.

An optical semiconductor device 1-2 depicted in FIG. 2 is configured in such a manner that a non-illustrated electrode of an optical semiconductor element 3 is faced down through a solder bump 8 and collectively connected to a lead frame 6 and the optical semiconductor element 3 is FC (flip chip)-mounted in a cup-like premolded package 2 integrally molded so that the lead frame 6 can be arranged on an internal bottom surface, and the inside of the premolded package 2 is sealed with a sealing resin 7.

Here, as a base metal of the lead frame 6, a material obtained by plating copper with silver having a thickness of 0.5 to 5 μm is used. Further, as the sealing resin 7, a cured product of an addition curing silicone resin composition is used.

Figure 3:
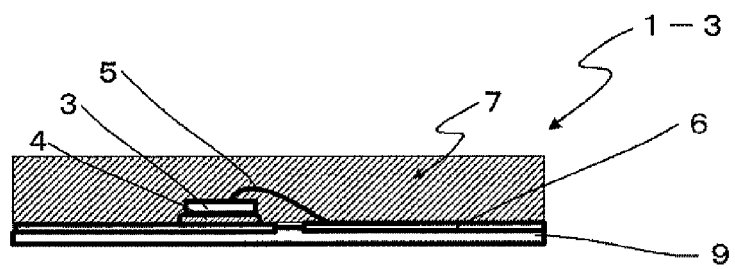
FIG. 3 is a schematic cross-sectional view showing a third mode of the optical semiconductor device according to the present invention.
Figure 4:
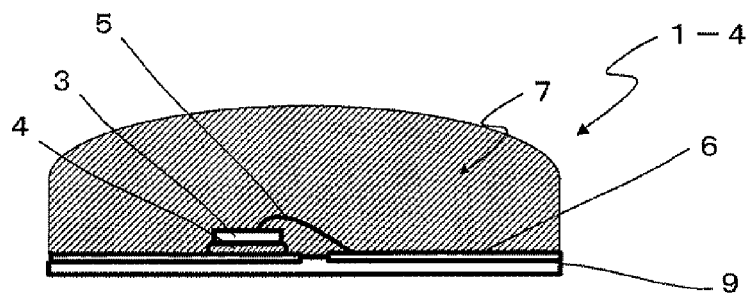
FIG. 4 is a schematic cross-sectional view showing a fourth mode of the optical semiconductor device according to the present invention.

Furthermore, FIGS. 3 and 4 are schematic cross-sectional views of optical semiconductor devices according to a third mode and a fourth mode of the optical semiconductor device according to the present invention. In both an optical semiconductor device 1-3 depicted in FIG. 3 and an optical semiconductor device 1-4 depicted in FIG. 4, a lead frame 6 is arranged on a protective film 9, an electrode of an optical semiconductor element 3 is connected to the lead frame 6 through a conductive adhesive 4, the optical semiconductor element 3 is mounted, and a lead frame surface is directly molded to effect sealing using a sealing resin 7.

[Addition Curing Silicone Resin Composition]

The addition curing silicone resin composition used for the optical semiconductor device according to the present invention contains the components (A) to (C).

[Blending Amounts of Component (A) and Component (B)]

In regard to the component (B), a molar ratio of a hydrosilyl group in the component (B) to an alkenyl group in the component (A) (SiH group/alkenyl group) is 0.70 to 1.00, and this ratio is important for durable prevention of discoloration of the sealing resin. This ratio is preferably 0.75 to 1.00, and it is particularly preferably 0.80 to 1.00.

A curing reaction of the composition does not satisfactorily advance and characteristics of the sealing resin become insufficient when the molar ratio is less than 0.7, and a large amount of the unreacted hydrosilyl group remains in the cured product when the molar ratio exceeds 1.00. Therefore, it can be considered that silver ions on a silver interface of the base metal of the lead frame are dispersed on the silver-plated surface or in the sealing resin, the silver ions return to silver due to a reduction reaction with the unreacted hydrosilyl group, and it returns to yellow-brown nanosilver at this moment. Such an oxidation-reduction reaction after dispersion to the silver-plated copper surface as the lead frame base metal or into the sealing resin facilitates an elution reaction of the nanosilver from the lead frame base metal, especially discolors the sealing resin from yellow to brown, and can be a factor that reduces luminance of a light-emitting element of the optical semiconductor device.

In particular, since a methyl silicone resin or the like has high gas permeability, it can be considered that silver ions are dispersed into air without immanency and discoloration does not occur even if the silver ions are eluted. Moreover, since an epoxy resin has very low gas permeability, elution of the silver ions on the silver-plated surface or the sealing resin surface can be prevented. However, in case of an aryl group containing silicone resin having excellent transparency, its gas permeability exercises intermediate transparency of the above-described resins, and hence it is considered that the silver ions are tend to be immanent in the resin or on the silver-plated surface.

On the other hand, when the molar ratio is set to 0.7 to 1.00, the curing reaction greatly advances, which is sufficient for the sealing resin. Additionally, since the unreacted hydrosilyl group does not remain in the cured product, even if the silver ions produced from the lead frame surface diffuse on the silver-plated surface or in the sealing resin, they not react with the unreacted hydrosilyl group. Therefore, in particular, the sealing resin is not discolored, and luminance of the light-emitting element in the optical semiconductor device is not lowered. Each component of the addition curing silicone resin composition will now be described hereinafter.

[(A) Organopolysiloxane that Contains Aryl Group and Alkenyl Group]

The component (A) of the addition curing silicone resin composition according to the present invention is organopolysiloxane that contains an aryl group and an alkenyl group but does not contain an epoxy group, and this component can be represented by the following average composition formula (1),

$$R^1_a(R^2)_b(R^3)_c SiO_{(4-a-b-c)/2} \qquad (1)$$

wherein a is 0.3 to 1.0 or preferably 0.4 to 0.8, b is 0.05 to 1.5 or preferably 0.2 to 0.8, c is 0.05 to 0.8 or preferably 0.05 to 0.3, and a+b+c=0.5 to 2.0 or preferably 0.5 to 1.6.

In the average composition formula (1), $R^1$ represents an aryl group or especially a phenyl group having a carbon number of 6 to 14 or preferably a carbon number of 6 to 10. $R^2$ represents a substituted or unsubstituted univalent hydrocarbon group having a carbon number of 1 to 10 or preferably a carbon number of 1 to 6 excluding the aryl group and the alkenyl group. As such $R^2$, there are an alkyl group such as a methyl group, an ethyl group, a propyl group, an isopropyl group, a butyl group, an isobutyl group, a tert-butyl group, a pentyl group, a neopentyl group, a hexyl group, an octyl group, a nonyl group, or a decyl group; an aralkyl group such as a benzyl group, a phenylethyl group, or a phenylpropyl group, a material obtained by substituting a part or all of hydrogen atoms of these groups by a halogen atom of fluorine, bromine, or chlorine, or a cyano group, e.g., a halogen substituted alkyl group such as a chloromethyl group, a chloropropyl group, a bromoethyl group, or a trifluoropropyl group, and a cyanoethyl group, and the methyl group is preferable.

In the average composition formula (1), $R^3$ represents an alkenyl group having a carbon number of 2 to 8 or preferably a carbon number of 2 to 6. As such $R^3$, there are, e.g., a vinyl group, an allyl group, a propenyl group, an isopropenyl group, a butenyl group, a hexenyl group, a cyclohexenyl group, and an octenyl group, and especially the vinyl group or the allyl group is desirable.

As such organosiloxane, there is a linear silicone oil and/or a silicone resin having a branched structure.

Generally, the silicon oil is organopolysiloxane having a linear structure in which a main chain thereof is constituted of repetition of a diorganosiloxane unit (($R_4)_2SiO_{2/2}$ unit) and both terminals of a molecular chain thereof are capped by triorganosiloxy groups (($R^4)_3SiO_{1/2}$ unit) (in the above formula, $R^4$ means $R^1$, $R^2$, or $R^3$ described above). Among others, linear organopolysiloxane having one or more vinyl groups for silicon atoms at both terminals of a molecular chain represented by the following average composition formula (2) and having a degree of viscosity of 10 to 1,000,000 mPa·s at 25° C. or more preferably 1000 to 50000 mPa·s is desirable in terms of workability, hardenability, and others. The degree of viscosity can be measured by a rotating viscometer.

In case of the silicone oil, the content of an aryl group of a substituent group (excluding an oxygen atom forming a siloxane bond) coupled with a silicon atom is preferably 5 mol % or above, or more preferably 8 to 60 mol %, or particularly preferably 10 to 50 mol %.

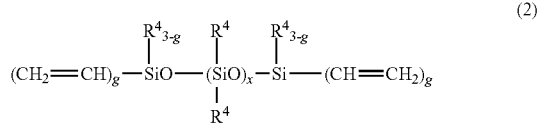

(2)

wherein $R^4$ represents a group selected from $R^1$, $R^2$, and $R^3$ which may be equal to or different from each other, and at least 5 mol % corresponds to the aryl group. g represents an integer that is 1, 2, or 3, and x represents an integer that is not smaller than 1 with which a degree of viscosity at 25° C. is 10 to 1,000,000 mPa·s.

As organopolysiloxane having such a component (A), there are specifically the following materials,

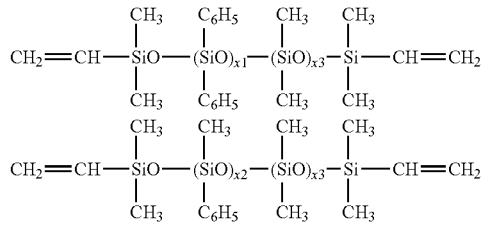

wherein x1 and x2 represent integers that are not smaller than 1, x3 represents an integer that is equal to or above 0, and x1+x3 and x2+x3 meet the same integer as x.

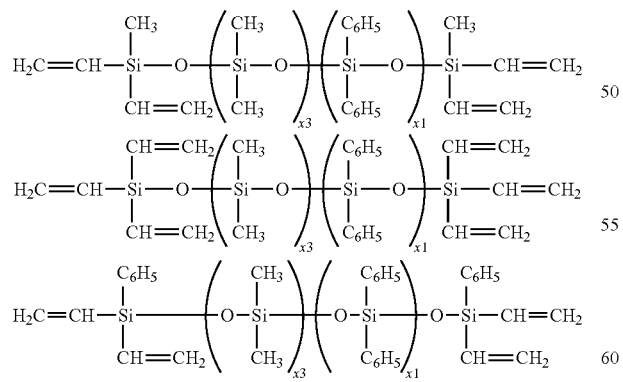

wherein x1 and x3 represent as described above.)

Further, a silicone resin as organopolysiloxane that is the component (A) has a branched structure represented by an $SiO_2$ unit (Q unit) and/or an $R^4SiO_{1.5}$ unit (T unit) in a molecule.

In case of the silicone resin, the content of an aryl group of a substituent group (excluding an oxygen atom forming a siloxane bond) coupled with a silicon atom is preferably 5 mol % or above, or more preferably 10 to 80 mol %, or particularly preferably 20 to 70 mol %.

Specifically, there are exemplified a silicone resin constituted of an $SiO_2$ unit and an $R^4{}_3SiO_{0.5}$ unit (M unit), a silicone resin constituted of an $R^4SiO_{1.5}$ unit, a silicone resin constituted of an $R^4SiO_{1.5}$ unit and an $R^4{}_2SiO$ unit (D unit), a silicone resin constituted of an $R^4SiO_{1.5}$ unit, an $R^4{}_2SiO$ unit, and an $R^4{}_3SiO_{0.5}$ unit, and others.

Furthermore, this organopolysiloxane whose weight average molecular weight calculated in terms of polystyrene based on GPO falls within the range of 500 to 100,000 is preferable.

Here, organopolysiloxane having a resin structure can be obtained by subjecting corresponding hydrolyzable group containing silane or siloxane to independent hydrolysis or cohydrolysis by a known method.

Here, as raw materials that adopt the Q unit, there are silicate soda, alkyl silicate, polyaryl silicate, silicon tetrachloride, and others.

As raw materials that adopt the T unit, there are methyltrichlorosilane, phenyltrichlorosilane, cyclohexyltrichlorosilane, methyltrimethoxysilane, phenyltrimethoxysilane, cyclohexyltrimethoxysilane, methyltriethoxysilane, phenyltriethoxysilane, cyclohexyltriethoxysilane, and others.

As raw materials adopting the M unit containing an alkenyl group, there are the following materials.

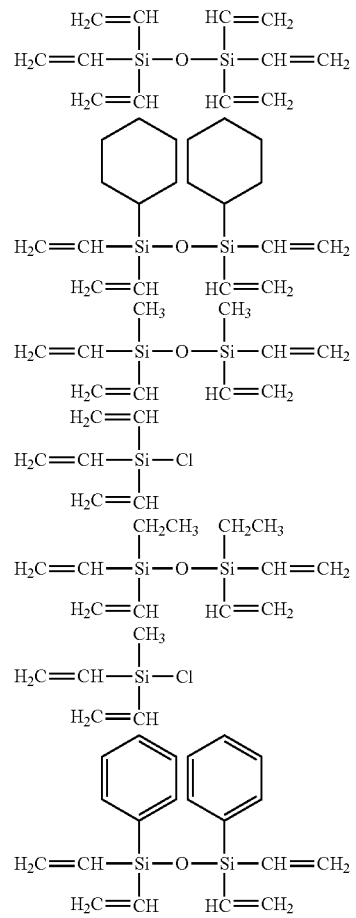

-continued

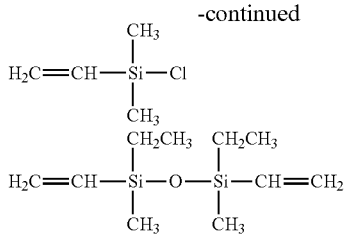

As raw materials adopting the M unit that does not contain an alkenyl group, there are the following materials.

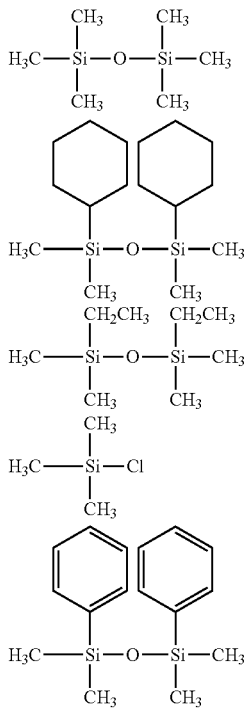

As the component (A), using both the silicone resin with the silicone oil is preferable. Using both these materials enables obtaining further excellent characteristics such as hardness, elasticity, or crack resistance for a sealant and improving surface tackiness. A blending ratio in terms of mass ratio of the silicone resin: the silicone oil is preferably 95 to 30:5 to 70, or more preferably 90 to 40:10 to 60, or particularly preferably 90 to 50:10 to 50.

[(B) Organohydrogenpolysiloxane]

The component B of the addition curing silicone resin composition according to the present invention is organohydrogenpolysiloxane having at least two hydrosilyl groups (SiH groups) per molecule and also having an aryl group, and it is also organohydrogenpolysiloxane containing 30 mol % or more of $HR_2SiO_{0.5}$ unit (R represents the same or different monovalent hydrocarbon groups containing no aliphatic unsaturated bond) in a constitutional unit.

This component (B) is organohydrogenpolysiloxane which is a cross-linking agent and forms a cured product when the hydrosilyl group (SiH group) in the component (B) is subjected to addition reaction with the alkenyl group in the component (A).

Although it is desirable for such organohydrogenpolysiloxane to have two or more or preferably three or more hydrosilyl groups (SiH groups) per molecule, organohydrogenpolysiloxane that can be represented by the following average composition formula (3) and has at least two (usually 2 to 300) or preferably three or more (e.g., 3 to 200) hydrogen atoms bonded to a silicon atom (SiH groups) per molecule is desirable, $$H_e(R)_f SiO_{(4-e-f)/2} \quad (3)$$

wherein R represents the same or different monovalent hydrocarbon groups containing no aliphatic unsaturated bond, and e and f represent numbers that meet $0.001 \le e < 2$, $0.7 \le f \le 2$, and $0.8 \le e+f \le 3$.

In the average composition formula (3), R is preferably the same or different monovalent hydrocarbon groups, whose number of carbon atom is 1 to 10 or especially 1 to 7, containing no aliphatic unsaturated bond and, for example, there are a lower alkyl group such as a methyl group, an aryl group such as a phenyl group, and those exemplified in terms of the substituent group $R^2$ in the average composition formula (1).

Further, e and f are numbers that meet $0.001 \le e < 2$, $0.7 \le f \le 2$, and $0.8 \le e+f \le 3$, and they are preferably numbers that meet $0.05 \le e \le 1$, $0.8 \le f \le 2$, and $1 \le e+f \le 2.7$. A position of the hydrogen atom bonded to the silicon atom is not restricted in particular, and it may be a terminal or a non-terminal of a molecule.

As such organohydrogenpolysiloxane, there are, e.g., tris (dimethylhydrogensiloxy) methylsilane, tris (dimethylhydrogensiloxy) phenylsilane, 1,1,3,3-tetramethyldisiloxane, 1,3,5,7-tetramethylcyclotetrasiloxane, methyhydrogenpolysiloxane having trimethylsiloxy group-capped termini, dimethylsiloxane.methylhydrogensiloxane copolymer having trimethylsiloxy group-capped termini, dimethylpolysiloxane having dimethylhydrogensiloxy group-capped termini, dimethylsiloxane.methylhydrogensiloxane copolymer having dimethylhydrogensiloxy group-capped termini, methylhydrogensiloxane.diphenylsiloxane copolymer having trimethylsiloxy group-capped termini, methylhydrogensiloxane-.diphenylsiloxane.dimethylsiloxane copolymer having trimethylsiloxy group-capped termini, a copolymer constituted of a $(CH_3)_2HSiO_{1/2}$ unit and an $SiO_{4/2}$ unit, a copolymer constituted of a $(CF_{13})_2HSiO_{1/2}$ unit, an $SiO_{4/2}$ unit, and a $(C_6H_5)SiO_{3/2}$ unit, and others.

Furthermore, organohydrogenpolysiloxane obtained by using a unit represented by the following structure can be also used.

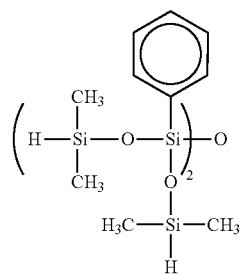

As such organohydrogenpolysiloxane, there is the following material.

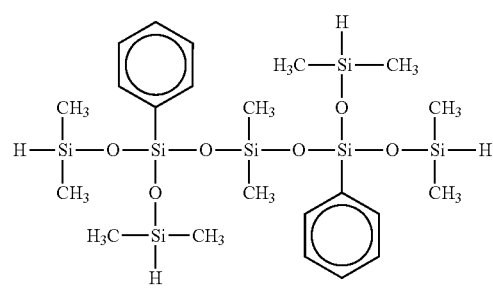

As described above, although a molecular structure of organohydrogenpolysiloxane as the component (B) may be any one of a linear structure, an annular structure, a branched structure, and a three-dimensional net-like structure, organohydrogenpolysiloxane in which a number (a degree of polymerization) of silicon atoms per molecule is 3 to 1,000, especially 3 to 300 can be adopted.

Such organohydrogenpolysiloxane can be usually obtained by hydrolyzing chlorosilane such as $RSiHCl_2$, $R_3SiCl$, $R_2SiCl_2$, or $R_2SiHCl$ (R is as described above) or by equilibrating siloxane acquired by hydrolysis.

Among others, when organohydrogenpolysiloxane having an $HR_2SiO_{0.5}$ unit at its terminal is used, not only reactivity is enhanced but also a reduction reaction with silver ions or a copper oxide is apt to occur. Therefore, if a molar ratio of a hydrosilyl group in the component (B) to an alkenyl group in the component (A) (SiH group/alkenyl group) corresponds to an amount of 0.70 to 1.00, an $R_2HSiO_{0.5}$ unit at the terminal having high reactivity is annihilated by an addition reaction with respect to the alkenyl group in the component (A), and hence discoloration does not occur. Therefore, the $R_2HSiO_{0.5}$ unit at the terminal must contain 30 mol % or above in a constitutional unit in the entire component (B). If the unit is less than 30 mol %, an amount of branched hydrogenpolyorganosiloxane with low reactivity is increased, thereby obtaining a resin with slow reactivity.

Two or more types of such components (B) can be combined and used. In such components, using organohydrogenpolysiloxane represented by the following formulae (B1) and (B2) is preferable,

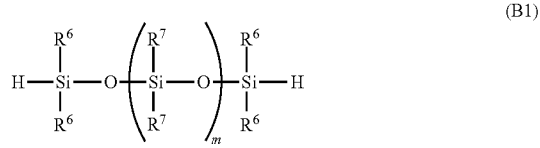

(B1)

wherein $R^6$ represents a monovalent hydrocarbon group having a carbon number of 1 to 10, $R^7$ represents a monovalent hydrocarbon group containing at least one aryl group, and m represents an integer of 1 to 4,

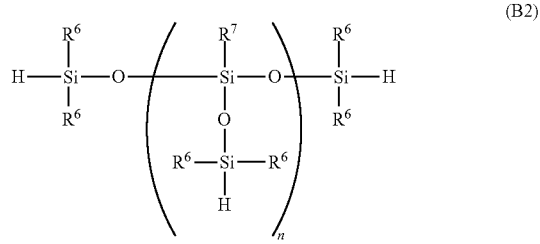

(B2)

wherein $R^6$ and $R^7$ represent the same as those described above, and n represents an integer of 1 to 100. In particular, using both (B1) and (B2) is preferable, and a ratio of these components is preferably 99:1 to 50:50 and particularly preferably 95:5 to 60:40 in terms of a ratio by weight.

It is to be noted that 5 to 70 mol % of substituent groups (excluding oxygen forming a siloxane bond) directly bonded to silicon atoms in (B) preferably correspond to an aryl group or especially a phenyl group. Such an addition curing silicone resin composition has higher transparency, and it is suitable for an optical semiconductor device.

[(C) Catalyst]

The component (C) is a catalyst that causes an addition curing reaction of the addition curing silicone resin composition.

As such a catalyst, there is a platinum based catalyst, a palladium based catalyst, or a rhodium based catalyst but, in terms of cost and others, there is a platinum based catalyst such as platinum, platinum black, or a chloroplatinic acid, e.g., $H_2PtCl_6.mH_2O$, $K_2PtCl_6$, $KHPtCl_6.mH_2O$, $K_2PtCl_4$, $K_2PtCl_4.mH_2O$, or $PtO.mH_2O$ (m is a positive integer), or a complex of such materials and carbon hydride like olefin, alcohol, or vinyl group containing organopolysiloxane, and such catalysts may be solely used, or two or more types of such catalysts may be combined and used.

A blending amount of these catalyst components is a curing effective amount, a so-called catalyst amount can suffice, and it is usually used in the range of 0.1 to 1,000 ppm or especially 0.5 to 200 ppm in terms of a mass of platinum group metals with respect to 100 parts by mass which is a total amount of the component (A).

[(D) Adhesion Promoter]

Further, the addition curing silicone resin composition preferably comprises an adhesion promoter (D). As the adhesion promoter, there are silane coupling agents such as vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, N-2 (aminoethyl)-3-aminopropylmethyldimethoxysilane, N-2 (aminoethyl)-3-aminopropyltrimethoxysilane, N-2 (aminoethyl)-3-aminopropyltriethoxysilane, 3-aminopropyltrimethoxysilane, 3-aminopropyltriethoxysilane, N-phenyl-3-aminopropyltrimethoxysilane, or 3-mercaptopropyltrimethoxysilane, siloxane having a reactive group such as an epoxy group, a methacryloxy group, an amino group, a mercapto group, or an alkoxy group, and others in a molecule, a silane coupling agent having an epoxy group or siloxane having an epoxy group is preferable, and organopolysiloxane having an aryl group, an alkenyl group, and an epoxy group in a molecule is particularly preferable. As organopolysiloxane having an aryl group, an alkenyl group, and an epoxy group in a molecule, one represented by the following general formula can be exemplified. These adhesion promoters may be solely used, and two or more types of the adhesion promoters may be mixed and used,

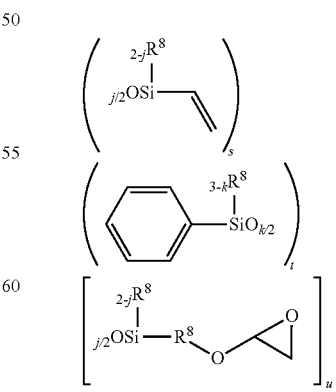

wherein $R^8$, independently of each other, represents a hydroxyl group or the same or different monovalent carbon hydrides. j=1 or 2, k=1, 2, or 3, s, t, and u represent positive numbers exceeding 0, and s+t+u=1 is achieved.

As a blending amount of such an adhesion promoter, 0.1 to 20 parts by mass with respect to 100 parts by mass of the component (A) is preferable, and 0.2 to 10 parts by mass is more preferable, and 0.5 to 5 parts by mass is particularly preferable. Adhesion improving effect may be insufficient when the blending amount is too small, and further adhesion improving effect cannot be obtained when the blending amount is too large, which may be disadvantageous in terms of cost.

[Other Component]

The addition curing silicone resin composition used in the present invention contains the above-described components (A) to (C) as essential components, and various known additives may be blended as required.

As such additives, there are a reinforcing inorganic filler such as fumed silica or fumed titanium dioxide, a non-reinforcing inorganic filler such as calcium carbonate, calcium silicate, titanium dioxide, ferric oxide, carbon black, or zinc oxide, an antioxidant such as BHT or vitamin B, a photodeterioration inhibiter such as hindered amine, a reactive diluent such as vinyl ethers, vinyl amides, an epoxy resin, oxetanes, ally phthalates, or vinyl adipate, and others.

[Addition Curing Silicone Resin Composition Preparative Method and Others]

The addition curing silicone resin composition can be obtained by agitating, dissolving, mixing, and dispersing the components (A) to (C) and the desired above-described other components simultaneously or separately while adding a heating treatment as required.

However, a pair of the component (A) and the component (C) and the component (B) are preserved as two types of liquids so as to prevent a curing reaction from advancing before use, and the two types of liquids are mixed and cured at the time of use. The components are divided as the two types of liquids in this manner because the identical compounding of the component (B) and the component (C) must be avoided because of the risk of a dehydrogenation reaction. Furthermore, a small amount of a curing inhibitor such as acetylene alcohol may be added to obtain one liquid to be used.

Although an apparatus used for an operation such as agitation is not restricted in particular, a grinder including agitation and heating apparatuses, three rolls, a ball mill, or a planetary mixer can be used. Moreover, these apparatuses may be appropriately combined.

It is to be noted that, as a degree of viscosity of the obtained addition curing silicone resin composition measured by a rotating viscometer at 25° C., a value of 100 to 10,000,000 mPa·s, especially a value of 300 to 500,000 mPa·s is preferable.

The thus obtained addition curing silicone resin composition is immediately hardened when heated as required, has high transparency, and well adheres to a package material such as an LCP or a metal substrate, and hence this composition is effective for sealing an optical semiconductor element, the optical semiconductor element is exemplified by, e.g., an LED, a photodiode, a CCD, a CMOS, or a photo coupler, and it is very effective for sealing the LED.

[Sealing Method]

As a sealing method, a known method associated with a type of optical semiconductor element is adopted, and curing conditions for the addition curing silicone resin composition are not restricted in particular, but the addition curing silicon resin composition can be cured usually at a room temperature to 250° C. or preferably 60 to 200° C. usually in one minute to 10 hours or preferably in approximately 10 minutes to six hours.

[Lead Frame]

It is to be noted that performing a surface treatment to the silver-plated lead frame is preferable in order to improve wettability of the addition curing silicone resin composition. When performing such a surface treatment, in the light of workability or maintainability of facilities, a dry method such as an ultraviolet treatment, an ozone treatment, or a plasma treatment is preferable, and the plasma treatment is particularly preferable. The lead frame subjected to the plasma treatment in this manner becomes the lead frame having high wettability of the addition curing silicone resin composition.

It is to be noted that the lead frame does not have to be subjected to the plasma treatment, which is preferable in terms of workability or a facility cost in this case.

In the optical semiconductor device sealed with a cured product of the thus obtained addition curing silicone resin composition, as descried above, since an unreacted hydrosilyl group does not remain in the cured product, discoloration of the cured product is suppressed, and the optical semiconductor device having excellent durability of reflection efficiency can be provided.

EXAMPLES

Although the present invention will now be specifically described hereinafter based on examples and comparative examples, the present invention is not restricted to the following examples.

Evaluation of Physical Properties

Examples 1 to 5, Comparative Examples 1 to 3

The following various materials were blended as shown in Table 1, uniformly kneaded to obtain various addition curing silicone resin compositions, and these addition curing silicon resin compositions were heated and molded under conditions of 150° C. and four hours, and various test pieces having a size of 10 mm (a length)×60 mm (a width)×1 mm (a thickness) were fabricated.

The thus obtained test piece was used, light having a wavelength of 450 nm was applied in a thickness direction, and an exterior of light transmission was observed by sight. Additionally, based on JIS K 6301, tension strength, hardness (measured using A type and D type spring test machines), and elongation were measured. Table 1 also shows a result.

[Materials Used]

1) Vinylphenyl resin 1: a vinyl phenyl resin having a resin structure consisting of 80 mol % of a $(C_6H_5)SiO_{1.5}$ unit and 20 mol % of a $(CH_3)_2ViSiO_{0.5}$ unit (a vinyl equivalence: 0.140 mol/100 g)

2) Vinylphenyl resin 2: a vinyl phenyl resin having a resin structure consisting of 70 mol % of a $(C_6H_5)SiO_{1.5}$ unit and 30 mol % of a $(CH_3)_2ViSiO_{0.5}$ unit (a vinyl equivalence: 0.198 mol/100 g)

3) Vinylphenyl oil 1: a vinyl phenyl oil represented by the following average composition formula (i) (a vinyl equivalence: 0.0185 mol/100 g)

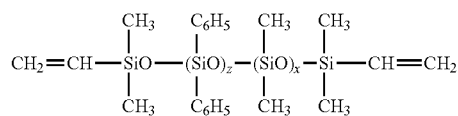

(z = 30, x = 68)

4) Vinylphenyl oil 2: a vinyl phenyl oil represented by the above average composition formula (i) (z=9, x=19) (a vinyl equivalence: 0.0590 mol/100 g)

5) Phenylhydrogenpolysiloxane 1: phenylhydrogenpolysiloxane represented by the following average composition formula (ii). An amount of a generated hydrogen gas: 94.02 ml/g (0.420 mol/100 g)

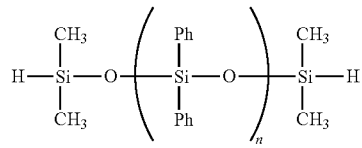

(n = 2)

6) Phenylhydrogenpolysiloxane 2: phenylhydrogenpolysiloxane represented by the following average composition formula (iii). An amount of a generated hydrogen gas: 170.24 ml/g (0.760 mol/100 g)

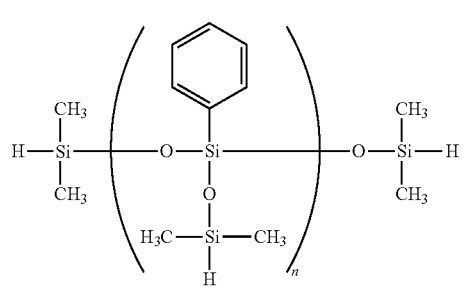

(n = 2)

7) Phenylhydrogenpolysiloxane 3: phenylhydrogenpolysiloxane represented by the following average composition formula (iv). An amount of a generated hydrogen gas: 169.8 ml/g (0.758 mol/100 g)

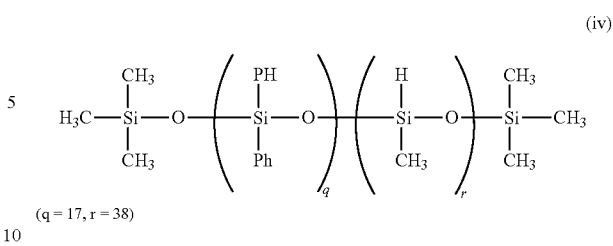

(q = 17, r = 38)

8) Platinum catalyst: a platinum catalyst: dimethyldiphenylpolysiloxane (which has dimethylvinylsilyl group-capped termini) solution of a platinum-divinyltetramethyldisiloxane complex [platinum atom content: 1 mass %]

9) Adhesion promoter 1: an adhesion promoter represented by the following formula (v).

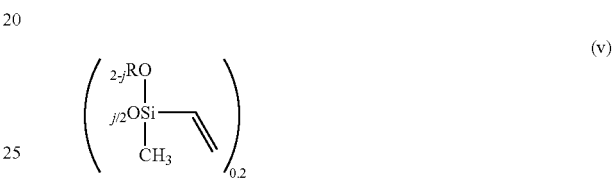
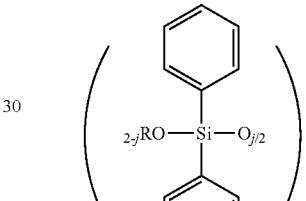
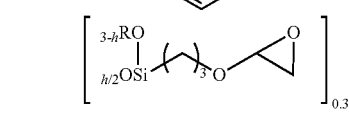

wherein h=1, 2, or 3, j=1 or 2, R=a mixture of compounds which are a hydrogen atom and a methyl group or an isopropyl group.

10) Adhesion promoter 2: an adhesion promoter represented by the following formula (vi)

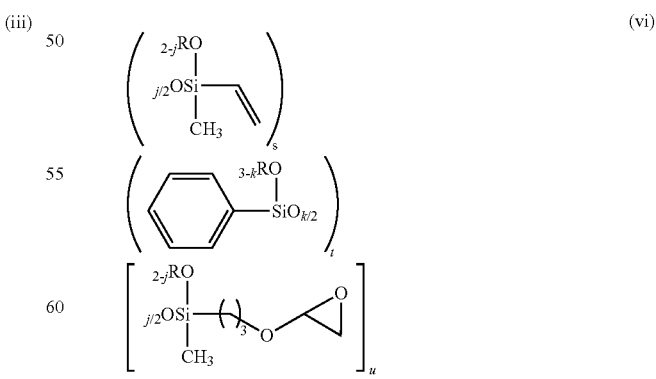

wherein j=1 or 2, k=1, 2, or 3, R=a mixture of compounds which are a hydrogen atom and a methyl group or an isopropyl group. s=0.2, t=0.5, and u=0.3.

TABLE 1

| | | Examples | | | | | Comparative examples | | |
|---|---|---|---|---|---|---|---|---|---|
| | | 1 | 2 | 3 | 4 | 5 | 1 | 2 | 3 |
| (Amount of Si—H)/(amount of unsaturated bond coupled with Si) | | 0.8 | 0.9 | 1.0 | 1.0 | 0.9 | 0.5 | 1.2 | 1.2 |
| Vinylphenyl resin 1 | Part | 100 | 100 | 100 | | 100 | 100 | 100 | 100 |
| Vinylphenyl resin 2 | Part | | | | 100 | | | | |
| Vinylphenyl oil 1 | Part | | | | 20 | | | | |
| Vinylphenyl oil 2 | Part | 15 | 15 | 15 | | 15 | 15 | 15 | 15 |
| Phenyl-hydrogen-polysiloxane 1 | Part | 21.26 | 23.93 | 26.58 | 38.42 | 31.90 | 14.18 | 34.02 | |
| Phenyl-hydrogen-polysiloxane 2 | Part | 3.92 | 4.41 | 4.90 | 5.31 | | 1.96 | 4.70 | |
| Phenyl-hydrogen-polysiloxane 3 | Part | | | | | | | | 23.56 |
| Platinum catalyst | Part | 0.02 | 0.02 | 0.02 | 0.02 | 0.02 | 0.02 | 0.02 | 0.02 |
| Adhesion promoter 1 | Part | | | | 2 | | | | |
| Adhesion promoter 2 | Part | 2 | 2 | 2 | | 2 | 2 | 2 | 2 |
| After curing | Appearance | Colorless and transparent | Colorless and transparent | Colorless and transparent | Colorless and transparent | Colorless and transparent | Colorless and transparent | Colorless and transparent | Colorless and transparent |
| Hardness | Type D | 33 | 31 | 36 | 21 | | | 41 | |
| | Type A | 90 | 88 | 91 | 85 | 57 | 85 | 92 | 83 |
| Tension strength | MPa | 4.7 | 3.1 | 5.5 | 3.5 | 1.8 | 7.6 | 4.7 | 3.1 |
| Elongation | % | 105 | 95 | 125 | 70 | 180 | 120 | 105 | 35 |

As shown in Table 1, in regard to Examples 1 to 5 and Comparative Examples 1 and 2, sufficient physical properties (hardness, tension strength, elongation) were confirmed. On the other hand, in regard to Comparative Example 3, sufficient physical properties were not confirmed, and Comparative Example 3 has poor tension strength and elongation.

Evaluation of Discoloration Degree

Examples 6 to 10 and Comparative Examples 4 to 6

Further, various addition curing silicone resin compositions according to Examples 1 to 5 and Comparative Examples 1 to 3 were used, LED devices were fabricated, and discoloration degrees were evaluated.

That is, an Ar plasma (an output: 100 W, an irradiation time: 10 seconds) was performed under reduced pressure with respect to a cup-like LED premolded package (3 mm×3 mm×1 mm, a diameter of an opening portion: 2.6 mm) having silver-plated copper lead frame with a thickness of 2 μm arranged on a bottom surface, an electrode of an InGaN based blue light emitting element was connected to the lead frame on the bottom surface using a silver paste (a conductive adhesive), a counter electrode of the light emitting element was connected to a counter lead frame through a gold wire, a package opening portion was filled with each of the various addition curing silicone resin compositions, and each addition curing silicone resin composition was cured at 60° C. for one hour and at 150° C. for four hours and sealed.

The thus obtained LED device was left in a 100° C. atmosphere for 500 hours, and then a discoloration degree near a silver-plated surface in the package was visually checked. Furthermore, the LED device was left in a 85° C. atmosphere with humidity of 85% for 500 hours, and then a discoloration degree near the silver-plated surface in the package was visually confirmed. Table 2 shows a result.

TABLE 2

| | Example 6 | Example 7 | Example 8 | Example 9 | Example 10 | Comparative Example 4 | Comparative Example 5 | Comparative Example 6 |
|---|---|---|---|---|---|---|---|---|
| Left at 100° C., appearance | Colorless and transparent | Colorless and transparent | Colorless and transparent | Colorless and transparent | Colorless and transparent | Changed into brownish color | Changed into brown color | Colorless and transparent |
| Left at 85° C. with 85 RH %, appearance | Colorless and transparent | Colorless and transparent | Colorless and transparent | Colorless and transparent | Colorless and transparent | Changed into brownish color | Changed into brown color | Changed into brownish color |

As shown in Table 2, in regard to each of Examples 6 to 10, discoloration near the silver-plated surface in the package was not confirmed. On the other hand, in regard to each of Comparative Examples 4 to 6, a color near the silver-plated surface in the package was changed into a brownish color, and obvious reduction in light emission intensity was confirmed in visual observation with respect to each of Examples 6 to 10. Further, in regard to Comparative Example 6, a color near the silver-plated surface in the package was changed into a brownish color, but obvious reduction in light emission intensity was not observed in visual observation with respect to Examples 6 to 10.

It is to be noted that the present invention is not restricted to the foregoing embodiments. It is to be noted that the foregoing embodiments are illustrative examples, and any examples that have the substantially the same configurations and exercise the same operations and effects as the technical concept described in claims according to the present invention are included in the technical scope of the present invention.

What is claimed is:

1. An optical semiconductor device in which an optical semiconductor element connected to a silver-plated copper lead frame is sealed with a cured product of an addition curing silicone resin composition, wherein the addition curing silicone resin composition comprises:
    (A) organopolysiloxane that contains an aryl group and an alkenyl group and does not contain an epoxy group;
    (B) organohydrogenpolysiloxane that has at least two hydrosilyl groups (SiH groups) per molecule and also has an aryl group, the organohydrogenpolysiloxane that contains 30 mold or more of an $HR_2SiO_{0.5}$ unit (R represents the same or different monovalent hydrocarbon groups which contain no aliphatic unsaturated bond) in a constituent unit having an amount that a molar ratio of the hydrosilyl group in the component (B) with respect to the alkenyl group in the component (A) (SiH group/alkenyl group) is 0.70 to 1.00; and
    (C) a hydrosilylation catalyst having a catalytic amount.

2. The optical semiconductor device according to claim 1, wherein the component (B) is organohydrogenpolysiloxane represented by the following formula (B1) and/or (B2),

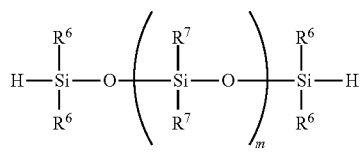

(B1)

wherein $R^6$ represents a monovalent hydrocarbon group having a carbon number of 1 to 10, $R^7$ represents a monovalent hydrocarbon group containing at least one aryl group, and m represents an integer of 1 to 4,

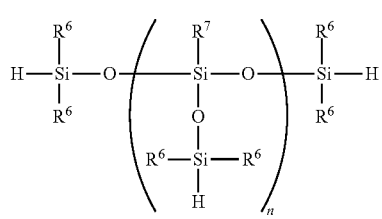

(B2)

wherein $R^6$ and $R^7$ are equal to those described above, and n represents an integer of 1 to 100.

3. The optical semiconductor device according to claim 1, wherein the component (A) is a mixture of a silicone resin and a silicone oil.

4. The optical semiconductor device according to claim 2, wherein the component (A) is a mixture of a silicone resin and a silicone oil.

5. The optical semiconductor device according to claim 1, further comprising an adhesion promoter (D), wherein the component (D) is organopolysiloxane containing an aryl group, an alkenyl group, and an epoxy group per molecule.

6. The optical semiconductor device according to claim 2, further comprising an adhesion promoter (D), wherein the component (D) is organopolysiloxane containing an aryl group, an alkenyl group, and an epoxy group per molecule.

7. The optical semiconductor device according to claim 3, further comprising an adhesion promoter (D), wherein the component (D) is organopolysiloxane containing an aryl group, an alkenyl group, and an epoxy group per molecule.

8. The optical semiconductor device according to claim 4, further comprising an adhesion promoter (D), wherein the component (D) is organopolysiloxane containing an aryl group, an alkenyl group, and an epoxy group per molecule.

9. The optical semiconductor device according to claim 1, wherein the lead frame is subjected to a plasma treatment.

10. The optical semiconductor device according to claim 2, wherein the lead frame is subjected to a plasma treatment.

11. The optical semiconductor device according to claim 1, wherein the optical semiconductor device has a cup-like premolded package integrally molded in such a manner that the lead frame is arranged on an inner bottom surface,
    in the premolded package, an electrode of the optical semiconductor element is connected to the lead frame through a conductive adhesive and a conductive wire and the optical semiconductor element is thereby mounted, or the electrode of the optical semiconductor element is faced down through a solder bump and collectively connected to the lead frame and the optical semiconductor element is thereby flip-chip-mounted, and
    the inside of the premolded package is sealed with the addition curing silicone resin composition.

12. The optical semiconductor device according to claim 2, wherein the optical semiconductor device has a cup-like premolded package integrally molded in such a manner that the lead frame is arranged on an inner bottom surface,
    in the premolded package, an electrode of the optical semiconductor element is connected to the lead frame through a conductive adhesive and a conductive wire and the optical semiconductor element is thereby mounted, or the electrode of the optical semiconductor element is faced down through a solder bump and collectively connected to the lead frame and the optical semiconductor element is thereby flip-chip-mounted, and
    the inside of the premolded package is sealed with the addition curing silicone resin composition.

13. The optical semiconductor device according to claim 1, wherein the optical semiconductor device has a substrate having the lead frame arranged thereon, the substrate having the optical semiconductor element, which is connected to the lead frame through a conductive adhesive and a conductive wire, mounted thereon being molded with the addition curing silicone resin composition, cured, and diced.

14. The optical semiconductor device according to claim 2, wherein the optical semiconductor device has a substrate having the lead frame arranged thereon, the substrate having the optical semiconductor element, which is connected to the lead frame through a conductive adhesive and a conductive wire, mounted thereon being molded with the addition curing silicone resin composition, cured, and diced.

* * * * *